United States Patent
Yamazaki et al.

(10) Patent No.: US 6,706,572 B1
(45) Date of Patent: Mar. 16, 2004

(54) METHOD FOR MANUFACTURING A THIN FILM TRANSISTOR USING A HIGH PRESSURE OXIDATION STEP

(75) Inventors: Shunpei Yamazaki, Tokyo (JP); Yasuhiko Takemura, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 375 days.

(21) Appl. No.: 09/615,078

(22) Filed: Jul. 12, 2000

Related U.S. Application Data

(62) Division of application No. 08/521,532, filed on Aug. 30, 1995, now Pat. No. 6,150,203.

(30) Foreign Application Priority Data

Aug. 31, 1994 (JP) ............................................... 6-232409

(51) Int. Cl.$^7$ .......................... H01L 21/336; H01L 21/28
(52) U.S. Cl. ........................ 438/166; 438/486; 438/487; 438/770; 438/787
(58) Field of Search ................................ 438/166, 486, 438/487, 795, 770, 773, 774, 787

(56) References Cited

U.S. PATENT DOCUMENTS

| | | | |
|---|---|---|---|
| 3,642,442 A | 2/1972 | Hoekje et al. |
| 3,652,331 A | 3/1972 | Yamazaki |
| 4,136,434 A | 1/1979 | Thibault et al. |
| 4,268,538 A | 5/1981 | Toole et al. |
| 4,293,590 A | 10/1981 | Takagi et al. |
| 4,305,200 A | 12/1981 | Fu et al. |
| 4,409,260 A | 10/1983 | Pastor et al. |
| 4,526,805 A | 7/1985 | Yoshizawa |
| 4,597,160 A | * | 7/1986 | Ipri |
| 4,599,247 A | 7/1986 | Bean et al. |
| 4,604,150 A | 8/1986 | Lin |

(List continued on next page.)

FOREIGN PATENT DOCUMENTS

| | | |
|---|---|---|
| EP | 0 631 325 A2 | 12/1994 |
| JP | 58-68923 | 4/1983 |
| JP | 59-28327 | 2/1984 |
| JP | 60-136304 | 7/1985 |
| JP | 61-63017 | 4/1986 |
| JP | 63-15468 | 1/1988 |
| JP | 1-132116 | 5/1989 |
| JP | 2-32527 | 2/1990 |
| JP | 2-143415 | 6/1990 |
| JP | 4-180219 | 6/1992 |
| JP | 5-82442 | 4/1993 |

OTHER PUBLICATIONS

S. Caune et al., *Combined CW Laser and Furnace Annealing of Amorphous Si and Ge in Contact with some Metals*, Applied Surface Science vol. 36, 1989, pp. 597–604.

(List continued on next page.)

*Primary Examiner*—Mary Wilczewski
(74) *Attorney, Agent, or Firm*—Eric J. Robinson; Robinson Intellectual Property Law Office, P.C.

(57) ABSTRACT

To provide a method of improving the characteristics and reliability of thin film transistors (TFT) which have been formed with a highest process temperature of not more than 700° C. Crystalline silicon films are thermally oxidized and TFT gate insulating films, for example, are formed with the oxide so obtained. At this time, the thermal oxidation is carried out at a temperature of 500–700° C. in such a way that no thermal damage is done to the substrate, for example, and a reactive gas which contains thermally excited or decomposed oxygen or nitrogen oxide ($NO_x$, where $0.5 \leq x \leq 2.5$) is used for the oxidizing gas. The oxidation reaction may be promoted by heating in an atmosphere of oxides of nitrogen at a high pressure of 2–10 atmospheres. Deterioration due to the implantation of hot electrons, for example, can be prevented and element reliability can be increased by using the thermal oxide films obtained in this way as gate insulating films.

23 Claims, 6 Drawing Sheets

U.S. PATENT DOCUMENTS

| | | | |
|---|---|---|---|
| 4,851,363 | A | 7/1989 | Troxell et al. |
| 4,851,370 | A | 7/1989 | Doklan et al. |
| 4,942,441 | A | 7/1990 | Konishi et al. |
| 5,100,815 | A | 3/1992 | Tsubone et al. |
| 5,110,407 | A | 5/1992 | Ono et al. |
| 5,112,764 | A | 5/1992 | Mitra et al. |
| 5,130,264 | A | 7/1992 | Troxell et al. |
| 5,147,826 | A | 9/1992 | Liu et al. |
| 5,212,397 | A | 5/1993 | See et al. |
| 5,275,851 | A | 1/1994 | Fonash et al. |
| 5,278,093 | A | 1/1994 | Yonehara |
| 5,313,075 | A | 5/1994 | Zhang et al. |
| 5,322,807 | A * | 6/1994 | Chen et al. |
| 5,372,958 | A | 12/1994 | Miyasaka et al. |
| 5,393,683 | A | 2/1995 | Mathews |
| 5,426,064 | A | 6/1995 | Zhang et al. |
| 5,485,019 | A | 1/1996 | Yamazaki et al. |
| 5,514,621 | A | 5/1996 | Tabara |
| 5,525,550 | A | 6/1996 | Kato |
| 5,534,716 | A | 7/1996 | Takemura |
| 5,543,352 | A | 8/1996 | Ohtani et al. |
| 5,569,935 | A | 10/1996 | Takemura et al. |
| 5,591,681 | A | 1/1997 | Wristers et al. |
| 5,608,232 | A | 3/1997 | Takemura et al. |
| 5,633,212 | A | 5/1997 | Yuuki |
| 5,639,698 | A | 6/1997 | Yamazaki et al. |
| 5,648,282 | A | 7/1997 | Yoneda |
| 5,661,311 | A | 8/1997 | Takemura et al. |
| 5,663,077 | A | 9/1997 | Adachi et al. |
| 6,319,761 | B1 * | 11/2001 | Zhang et al. |

OTHER PUBLICATIONS

C. Hayzelden et al., *In Situ Transmission Electron Microscopy Studies of Silicide–Mediated Crystallization of Amorphous Silicon*, Appl. Phys. Lett. 60 (2), Jan., 1992, pp. 225–227.

A.V. Dvurechenskii et al., *Transport Phenomena in Amorphous Silicon Doped by Ion Implantation of 3d Metals*, Akademikian Lavrentev Prospetk 13, 630090 Novosibirsk 90, USSR, pp. 635–640.

T. Hempel et al., *Needle–Like Crystallization of Ni Doped Amorphous Silicon Thin Films*, Solid State Communications, vol. 85, No. 11, pp. 921–924, 1993.

Stanley Wolf Ph. D., et al., *Silicon Processing for the VLSI Era*, vol. 1, Process Technology, pp. 216–218.

C. Hayzelden et al., *Silicide Formation and Silicide–Mediated Crystallization of Nickel Implanted Amorphous Silicon Thin Films*, J. Appl. Phys., 73 (12), Jun. 15, 1993, pp. 8279–8289.

O. Schoenfeld et al., *Crystallization of Amorphous Silicon by $NiSi_2$ Precipitates*, Thin Solid Films 261 (1995), pp. 236–240.

Batstone et al., *In Situ TEM Studies of the Crystallization of Amorphous Silicon: The Role of Silicides*, Microscopy of Semiconducting Materials 1993, pp. 165–172.

M. Bonnel, et al., *Polycrystalline Silicon Thin–Film Transistors with Two–Step Annealing Process*, IEEE Electron Device Letters, vol. 14, No. 12, Dec. 1993, pp. 551–553.

English Translation of Japanese Patent Office Communication about Claim Rejections of Corresponding Japanese Patent Application.

Specification, Claims, Abstract of U.S. Ser. No. 09/222,185 filed Dec. 29, 1998.

Tsubouchi et al., Proceedings of the 9th Conference on Solid State Devices, Tokyo, 1977, Japanese Journal of Applied Physics, vol. 17(1978), pp. 223–228, "Supression of Oxidation–Induced Stacking Fault Formation in Silicon by High Pressure Steam Oxidation".

Sameshima et al., Tokyo University of Agriculture and Technology, Tokyo 184–8588, Japan, AM–LCD '98, pp. 97–100, "Improvement in Characteristics of Thin Film Transistors by Heat Treatment with $H_2O$ Vapor".

Stanley Wolf, Silicon Processing for the VLSI Era, vol. 1, pp. 183–184 and 216–217, 1986.

A.B. Joshi et al., "Oxynitride Gate Dielectrics for p + – Polysilicon gate MOS devices", IEEE Electron Devices Letters, vol. 14, No. 12, Dec., 1993.

S. Wolf, "Silicon Processing for the VLSI Era", vol. 3, Lattice Press, Sunset Beach, CA (1995) pp. 648–651.

A.T. Wu et al., "Nitridation–induced surface donor layer in silicon", Appl. Phys. Lett. V. 55, No. 16, pp. 1665–1667.

J. Ahn et al., "High quality thin gate oxide prepared by annealing low pressure chemical vapor deposited $SiO_2$ in $N_2$O", Appl. Phys. Lett. V. 59, No. 3, pp. 283–285.

S.C. Kim et al., "Effects of $N_2$ plasma treatment on $SiO_2$ gate insulator in a–si:H thin film transistor", Mat. Res. Soc. Symp. Proc. vol. 336.

G. Liu et al., "Polycrystalline silicon thin film transistors on Corning 7059 glass substrates using short time, low–temperature processing", Appl. Phys, Lett. 62(20), May 17, 1993, pp. 2554–2556.

G. Liu et al., "Selective area crystallization of amorphous silicon films by low–temperature rapid thermal annealing", Appl. Phys. Lett. 55(7), Aug. 14, 1989, pp. 660–662.

Stanley Wolf, Silicon Processing for the VLSI Era, vol. 1, pp. 183–185, 1986.

* cited by examiner

METHOD FOR MANUFACTURING A THIN FILM TRANSISTOR USING A HIGH PRESSURE OXIDATION STEP

This application is a Divisional of application Ser. No. 08/521,532 filed Aug. 30, 1995, now U.S. Pat. No. 6,150,203.

BACKGROUND OF THE INVENTION

1. Field of the Invention

The present invention relates to thin film type insulated gate semiconductor devices formed on various types of insulating substrates, for example, glass substrates, silicon wafers having an insulating film formed thereon. More specifically, the present invention relates to thin film transistors (TFTs) or thin film diodes (TFDs) and integrated circuits using these thin film devices, for example, active matrix electro-optical devices such as liquid crystal devices. The present invention further relates to a manufacturing method of these devices. In particular, the present invention relates to a low temperature process in which the highest process temperature is preferably not higher than 700° C., more preferably 650° C. or lower.

2. Description of the Prior Art

Semiconductor devices which have TFT on an insulating substrate such as a glass, such as active liquid crystal display devices and image sensors in which TFTs are used to drive picture elements for example, have been developed in recent years. Glass substrates which have a strain point of not more than 750° C., and typically of 550–680° C., are generally used for these substrates in view of both mass productivity and cost. Hence, the highest process temperature when such glass substrates are used must be not more than 700° C.

Thin film-like silicon semiconductors have generally been used for the TFTs. The thin film silicon semiconductors can be broadly classified into two types, namely those consisting of an amorphous silicon semiconductor (a-Si) and those consisting of a silicon semiconductor which has crystallinity. The amorphous silicon semiconductors can be manufactured comparatively easily through a vapor phase method with a low production temperature, and they are suitable for mass production. Therefore, the amorphous semiconductors are used most generally, but their properties, such as their electric field effect mobility and electrical conductivity for example, are poor when compared with those of silicon semiconductors which have crystallinity. Therefore, there is a considerable demand for the establishment of a method for the manufacture of TFTs using silicon semiconductors which have crystallinity for attaining high speed characteristics.

The characteristics of the gate insulating film are not a serious problem in the case of a TFT where amorphous silicon which has a small mobility has been used. For example, a silicon nitride film which has poor electrical characteristics when compared with silicon oxide can be used for the gate insulating film of a TFT in which amorphous silicon has been used. However, with a TFT in which a crystalline silicon film which has a high mobility is used, the characteristics of gate insulating films are very important as well as the characteristics of silicon films.

The demand for good quality gate insulating films has become very great, especially in view of the improvement in the technology for obtaining crystalline. silicon films. In this connection, with a TFT having a crystalline silicon film in which the channel forming region is comprised of essentially one single crystal or a plurality of crystals and the orientations of all of the crystals are the same (such crystalline forms are known as a mono-domain), the existence of the grain boundaries hardly affects the characteristics of the device, unlike with the usual TFT in which the polycrystalline silicon is used, and the electrical characteristics are determined almost entirely by the characteristics of the gate insulating film.

More specifically, the crystal orientations of two crystals which form a grain boundary are different from one another in the usual polycrystalline structure and, as a result, a high grain boundary barrier is produced. However, even though it is comprised of a plurality of crystals, in a mono-domain structure the crystal orientations of the two crystals which form a grain boundary corresponding to a grain boundary in the usual polycrystalline material are the same and so the barrier at such a boundary is very low, and it is no different from a single crystal. Consequently, in a mono-domain structure the contribution of the grain boundaries to the TFT characteristics is very small, and the characteristics are determined mostly by the gate insulating film.

Thermal oxide films are known as excellent gate insulating films which are ideal for such a purpose. For example, gate insulating films can be obtained using the thermal oxidation method provided that they are on a substrate such as a quartz substrate which can withstand high temperatures. (For example, JP-B-H3-71793) (The term "JP-B" as used herein signifies an examined Japanese patent publication")

Thermal oxide films have very few defects which act as traps when charges such as hot electrons, for example, are implanted and so there is little deterioration in their characteristics, and it has been possible to produce elements which have a high degree of reliability.

A high temperature of at least 950° C. is required to obtain a silicon oxide film which can be used as a gate insulating film by means of the thermal oxidation method, and there is no other substrate material apart from quartz which can withstand such high temperatures. A maximum process temperature of not more than 700° C., and preferably of not more than 650° C., is required if glass substrates which have a low strain point as described above are to be used, and it is impossible to satisfy this requirement with the thermal oxidation method.

Gate insulating films must be produced using physical gas phase growth (PVD) methods, such as the sputter method, or chemical gas phase growth (CVD) methods, such as the plasma CVD method and the thermal CVD method, because of these problems. A highest process temperature of not more than 650° C. is a possibility with these methods.

However, insulating films which have been produced using the PVD methods and CVD methods have high concentrations of dangling bonds and hydrogen, and the boundary characteristics are not good. Consequently, they are weak in respect of the implantation of hot electrons, for example, and charge trapping centers are liable to be formed because of the presence of the dangling bonds and hydrogen. Consequently, when used as gate insulating films for TFT, there is a problem in that the electric field mobility and the sub-threshold characteristic value (S value) are not good, or there is a problem in that the leakage current of the gate electrode is considerable and the fall in the ON current (deterioration, change with the passage of time) is considerable.

SUMMARY OF THE INVENTION

The present invention provides a means of resolving the above mentioned problems. That is to say, the theme of the invention is to provide a method with which gate insulating films can be manufactured using crystalline silicon films with a thermal oxidation method of which the highest process temperature is not more than 700° C.

In the present invention, a thermal oxide film is formed on the surface of a silicon film at a low temperature of 400–700° C., and typically of 550–650° C., by heat treating the silicon film in a specified atmosphere. In the present invention, the silicon film is thermally oxidized and a silicon oxide film is obtained by carrying out a thermal anneal at 400–700° C. in a highly reactive atmosphere of oxygen or ozone, or nitrogen oxide (general formula $NO_x$, where $0.5 \leq x \leq 2.5$), which contains thermally excited, or thermally decomposed, components. Dinitrogen monoxide ($N_2O$), nitrogen monoxide (NO), nitrogen dioxide ($NO_2$), or a mixture of these gases is preferred for the nitrogen oxide which is used when carrying out the thermal oxidation in the present invention.

The inclusion of hydrogen compounds such as water ($H_2O$) in these atmospheres results in the inclusion of hydrogen in the thermal oxide films which are obtained and so this is undesirable. Similarly, the inclusion of carbon based gases (CO, $CO_2$ and the like) is also undesirable. The concentration of water or carbon based gas in the atmosphere is preferably not more than 1 ppm, and most desirably not more than 10 ppb.

A gas which contains thermally excited or decomposed nitrogen oxide (or oxygen) is referred to hereinafter as reactive nitrogen oxide (or reactive oxygen). In the present invention, the reactive nitrogen oxide (reactive oxygen) may be comprised solely of nitrogen oxide (oxygen), or it may be admixed with argon or other inactive gases.

The upper limit of the oxidation temperature is determined by the type of substrate which is being used. Naturally, the oxidizing action proceeds more readily as the thermal oxidation temperature is increased. A temperature of 550–650° C. is appropriate for a Corning 7059 substrate which is a typical glass substrate. In the present invention, the various glass substrates of which the strain temperature (strain point) is less than 750° C., and typically 550–680° C., as typified by Corning 7059 glass (alkali free boron silicate glass) should be used for the substrate.

An example of the apparatus for the execution of this invention is shown in FIGS. 1A and 1B. A first reaction chamber for thermally exciting the nitrogen oxide, or oxygen or ozone, initially and a second reaction chamber into which the reactive nitrogen oxide or oxygen obtained in the first reaction chamber is introduced for oxidizing the silicon film at a temperature of 400–700° C. are required. In FIG. 1(A), 1 is the first reaction chamber and 5 is the second reaction chamber. These reaction chambers, and the connecting passageway 4 between them, must be maintained at appropriate temperatures. The heaters 2, 3 and 6 are provided for this purpose.

A temperature which is sufficiently high to render the nitrogen oxide reactive is required in the first reaction chamber. That is to say, it must be above the temperature at which the nitrogen oxide is decomposed. The optimum temperature depends on the type of gas, and with dinitrogen monoxide, for example, a temperature of 750–950° C. is preferred. Furthermore, with oxygen a higher temperature of 1000–1200° C. is required for thermal excitation and decomposition.

The gas molecules which are excited in the first reaction chamber revert to the ground state in cases where the temperature in the conduit 4 between the first and second reaction chambers is very low, and the reactivity is reduced. Hence, an appropriate temperature must also be maintained in the connecting passageway 4 in order to maintain the reactivity. The temperature in the connecting passageway 4 is preferably intermediate between those in the first and second reaction chambers. That is to say, if the temperature in the first reaction chamber 1 is $T_A$, the temperature in the connecting passageway 4 is $T_B$ and the temperature in the second reaction chamber 5 is $T_C$, then $T_A \geq T_B \geq T_C$. Furthermore, it is desirable that the inner walls of the connecting passageway 4 should be made with a material of which main component is quartz so that it does not react with the reactive gas molecules. The use of quartz of a high purity, comprising at least 90 mol. % silicon oxide, is preferred.

If the inner wall is comprised of a metallic material, the atoms or excited molecules may revert to the ground state or be stabilized by recombining, and the reactivity is lost. However, in those cases where the inner walls are made of quartz this effect is slight and, for example, most of the atoms and molecules are still in an active state even at a distance of 50–100 cm from the first reaction chamber.

A plurality of substrates 8 are mounted on the susceptor 7 in the second reaction chamber 5 and a plurality of substrates can be treated at once. Since a high temperature gas flows from the first chamber into the second reaction chamber, it is necessary to increase the uniformity of the temperature distribution in the second reaction chamber 5 by optimizing the temperature and length of the connecting passageway 4. If there is a temperature distribution within the second reaction chamber it is difficult to treat a plurality of substrates at the same time in a uniform manner. Furthermore, reducing the pressure of the gaseous atmosphere below atmospheric pressure is also effective.

It is difficult to render most of the gas molecules in the first reaction chamber reactive in the example shown in FIG. 1A. This is because thermal energy required to excite or decompose the gas must be obtained from the walls of the reaction chamber, and only a part of the total number of gas molecules can contact with the wall in the first reaction chamber. More precisely, reactivity is achieved by means of the kinetic energy of other gas molecules, but the energy imparted is obtained directly from other gas molecules or indirectly from the walls of the reaction chamber. Of course, the invention can be carried out if just a few reactive molecules are present. Needless to say, however, the effect of the invention increases as the number of reactive molecules is increased.

A material 9 which conducts heat comparatively easily or which absorbs infrared radiation easily, such as a metal, can be placed within the first reaction chamber, as shown in FIG. 1B, in order to render more gas molecules reactive. Preferably, this material should be in a form such as a mesh which has a large surface area, which does not impede the flow of gas and which makes contact with a large amount of gas. Most desirably, the material 9 has a catalytic action. Examples of such materials include platinum, palladium, (reduced) nickel, titanium, vanadium and cobalt. The catalyst may have a powder-like form or a granular form instead of being in the form of a mesh.

When in contact with such a material, the gas molecules become reactive in the same way as when making contact with the walls of the reaction chamber, and more gas molecules become reactive as the surface area becomes greater. Moreover, it is possible to obtain even more reactive gas if such materials have a catalytic action. Furthermore, the provision of a temperature which is higher than that in the first reaction chamber by passing an electric current through the mesh-like metal 9 is also effective.

If a means such as those indicated above is adopted then it is possible to lower the temperature in the first reaction chamber as compared with the case shown in FIG. 1A.

Oxidation not just at 1 atmosphere (atmospheric pressure) but under a pressure of more than 1 atmosphere, but not exceeding 15 atmosphere, is also effective for increasing the oxidation rate. For example, an oxidation rate ten times higher is obtained at a pressure of 10 atmospheres when compared with oxidation at a pressure of 1 atmosphere. Furthermore, the oxidation temperature can also be reduced.

The relationship between the oxidation time and the thickness of the thermal oxide film which is obtained using the apparatus shown in FIG. 1 is shown in FIG. 5. Here dinitrogen monoxide was used for the oxidizing atmosphere. The oxidizing action proceeded more easily as the temperature was increased and as the pressure was increased.

Amorphous silicon films obtained by means of a CVD method such as a plasma CVD method or a reduced pressure CVD method are to be used as a starting material for forming a crystalline silicon film as an active layer in the present invention, and the methods of crystallization can be divided broadly into two types. The first method is that in which an amorphous silicon film is formed and then this is crystallized by thermal annealing at a temperature of 500–650° C. for an appropriate period of time. Elements which promote the crystallization of amorphous silicon, such as nickel, iron, platinum, palladium and cobalt, may be added at the time of this crystallization. The crystallization temperature can be lowered and the crystallization time can be shortened if these elements are added.

The semiconductor characteristics of silicon are lost if these elements are included at high concentrations and so a low concentration which is enough for crystallization but which has virtually no effect on the semiconductor characteristics is preferred. That is to say, the minimum concentration in the silicon film as measured using secondary ion mass spectrometry (SIMS) is preferably $1\times10^{15}$–$3\times10^{19}$ atoms/cm$^3$. The concentration distribution of such elements which promote crystallization varies according to the method of treating the silicon film and so there are cases where the minimum value is obtained at a boundary and cases where the minimum value is obtained in the middle of the film.

The second method is a laser annealing method in which amorphous silicon films are crystallized by being irradiated with strong light from a laser for example. Which of the two methods indicated above is chosen should be determined on the basis of the characteristics of the TFT for which the execution of the invention is required, the apparatus which can be used and the plant costs, for example.

Furthermore, the first and second methods may be combined with each other. For example, the crystallinity may be further increased by a laser anneal after the crystallization by the thermal annealing. In those cases where a crystallization promoting element such as nickel is added and thermal annealing is carried out in particular, amorphous parts have been observed to remain at the crystal grain boundaries, and the laser annealing method is effective for crystallizing such amorphous parts.

Conversely, the stress and strain in the film produced by laser annealing can be alleviated by thermally annealing the silicon film which has been crystallized by means of a laser anneal.

The thermal oxide films obtained by means of this invention can be used even as they are as gate insulating films, but subjecting the thermal oxide films obtained to a thermal anneal at 400–700° C. in a hydrogen nitride atmosphere such as ammonia ($NH_3$) or hydrazine ($N_2H_4$) is good for improving the characteristics even further. The dangling bonds in the silicon oxide film are completely taken up with nitrogen by means of this thermal anneal and some of the oxygen is replaced with nitrogen, and it is possible to form electrically stable silicon oxinitride films.

Furthermore, while only the thermal oxide film may be used as a gate insulating film, if the thermal oxide film does not reach the sufficient thickness, a further insulating may be formed over the thermal oxide film by a PVD method or a CVD method for example, and an insulating film which has a multi-layer structure can be used as a gate insulating film. Insulating films obtained by means of a PVD method or a CVD method, for example, generally have very poor characteristics when compared with a thermal oxide film, but the effect on the TFT characteristics is sufficiently small provided that the surface of the active layer is covered with the thermal oxide film having a thickness of at least 200 Å.

A sputtering method can be used as a PVD method, and a plasma CVD, a reduced pressure CVD, and an atmospheric CVD method can be used as a CVD method, for example, for forming such insulating films in the present invention. Other methods of film formation can also be used. The plasma CVD methods and reduced pressure CVD method using TEOS as a raw material may be used. A substrate temperature of 200–500° C. is preferred for depositing a silicon oxide film using TEOS and oxygen as raw materials in the plasma CVD method. Furthermore, the reaction in which TEOS and ozone are used in a reduced pressure CVD method proceeds at a comparatively low temperature (for example, at 375° C.±20° C.), and silicon oxide films which are undamaged by the plasma can be obtained.

Similarly, silicon oxide films which are undamaged by a plasma can also be obtained with a reduced pressure CVD method using monosilane ($SiH_4$) and oxygen ($O_2$), or monosilane and dinitrogen monoxide, as raw materials.

The combination of monosilane and nitrogen oxide may be used in the plasma CVD method. Furthermore, in plasma CVD methods, the ECR-CVD method in which a discharge using an ECR (electron cyclotron resonance) condition is used causes little damage due to plasma and so it is possible to form even better gate insulating films with this method.

It was found by the inventors that insulating films which had silicon oxide which had been fortified to a certain extent was suitable for the gate insulating films of TFTs. Specifically, silicon oxide films of which the etching rate with a buffered hydrofluoric acid at 23° C., containing hydrogen fluoride, ammonium fluoride and acetic acid at proportion of 1:50:50, was not more than 1000 Å/minute, and typically 300–800 Å/minute, were preferred. Silicon oxide films which contain, on average, $1\times10^{17}$–$1\times10^{21}$ atoms/cm$^3$ of nitrogen mostly satisfy such an etching rate condition.

Insulating films which have been formed over a thermal oxide film in this way may be subjected to a thermal anneal in a dinitrogen monoxide atmosphere in order to improve their characteristics even further. This can be done at 300–700° C. Furthermore, the annealing effect can be increased by irradiating the insulating film with ultraviolet light during the thermal anneal, and a similar effect can be achieved at an even lower temperature. This is because the dinitrogen monoxide is brought into an active state by the ultraviolet light and is able to react more easily with the insulating film which has been deposited using a CVD or PVD method.

Similarly, the insulating film may be treated by generating a plasma in an atmosphere which contains dinitrogen monoxide. Here again, the dinitrogen monoxide is excited and activated by the plasma and can react with the insulating film. Furthermore, it is necessary to reduce the dinitrogen monoxide pressure for generating the plasma on treatment with this plasma and so a thermal anneal may be carried out at 400–700° C. in a dinitrogen monoxide atmosphere at a pressure of at least 0.1 atmosphere following the plasma treatment in order to complete the reaction more fully.

Atomic oxygen, or oxidizing molecules which have a similar reactivity to atomic oxygen, which has an oxidizing action must be formed in the atmosphere to make the oxidation reaction of silicon proceed. However, a very high temperature is required to obtain atomic oxygen for example from oxygen molecules. Consequently, thermal oxidation does not proceed in an atmosphere of dry oxygen unless the temperature is at least 1000° C.

The present invention is based on the observation that under the appropriate conditions, the atomic oxygen and excited states of oxides of nitrogen obtained by heating oxides of nitrogen, oxygen or ozone and thermally exciting or decomposing them have a sufficiently long lifetime and that spatial movement is possible. That is to say, gas molecules or atoms which are heated to a high temperature and rendered reactive are introduced into a reaction chamber at a lower temperature and, as a result of their use, the thermal oxidation proceeds at a lower temperature than that in the conventional thermal oxidation method. In the present invention, the use of oxides of nitrogen or oxygen or ozone which is heated to a temperature above its decomposition temperature to obtain more atomic oxygen or oxides on nitrogen in an excited state is preferred.

In the present invention, the effects such as those indicated below also arise when a silicon film which is crystallized by means of a thermal anneal is used. Generally, if the gate insulating film and the active layer are thin, good characteristics in that the mobility is improved and the OFF current is reduced are obtained as they become thinner. On the other hand, the crystallization of the initial amorphous silicon film can be achieved more easily as the film thickness is increased. Hence, in the past there has been a conflict between the characteristics and the processing aspect in terms of the thickness of the active layer. This invention resolves this conflict first of all, which is to say that a thick amorphous silicon film is formed before crystallization and a silicon film which has good crystallinity is obtained, and then the silicon film is reduced in thickness by oxidation, and the characteristics as a TFT are improved. Moreover, in the thermal oxidation the amorphous components and crystal grain boundaries where recombination centers are liable to exist are oxidized readily and there is an advantage in that the number of recombination centers in the active layer is effectively reduced. Consequently, the product yield is also high.

The invention has a special effect when applied to active layers comprising crystalline silicon films which are crystallized with the addition of elements which promote the crystallization of amorphous silicon films, such as nickel, cobalt, iron, platinum and palladium for example. The crystallinity of a silicon film which is crystallized with the addition of such crystallization promoting elements is good, and films in which the electric field effect mobility is also very high can be obtained, but films which have good characteristics as gate insulating films are desirable as well. The gate insulating films obtained with the present invention are suitable for this purpose. Furthermore, the noncrystalline regions which remain at the crystal grain boundaries, for example, can also be crystallized during the thermal oxidation, and the crystallinity can be improved even further.

When the present invention is applied to an active layer in which a silicon film which is laser annealed is used, in addition to the effect of improving the characteristics of the gate insulating film, the annealing process of the present invention also has the effect of alleviating the strain in the silicon film caused by the laser annealing.

Furthermore, in those cases where a silicon film which has very good crystallinity, such as a mono-domain structure, is used, characteristics similar to those of a thermal oxide film are required for the gate insulating film of the present invention.

EXAMPLES

Example 1

Cross sectional drawings which illustrate the manufacturing process of this example are shown in FIGS. 2A–2D. First of all, the base silicon oxide film 202 having a thickness of 2000 Å was formed in the substrate 201 (Corning 7059) using the sputtering method. The substrate was annealed at a temperature higher than the strain point before or after forming the base film, and then it was cooled gradually to a temperature below the strain point at a rate of 0.1–1.0° C./min and, as a result of this, the shrinkage of the substrate in subsequent processes which involved a rise in temperature (including the thermal oxidation process of the present invention and the subsequent thermal annealing process) was minimized and mask fitting was facilitated. The strain point of a Corning 7059 substrate is 593° C. and so, after annealing for 1–4 hours at 620–660° C., the substrate was cooled gradually at a rate of 0.03–1.0° C./minute, and preferably at a rate of 0.1–0.3° C./minute, and it was best taken out at the stage where the temperature had fallen to 400–500° C.

Next, a truly (type I) amorphous silicon film having a thickness of 500–1500 Å, for example having a thickness of 1000 Å, was formed using the plasma CVD method. This was subsequently annealed for 48 hours at 600° C. in a nitrogen atmosphere (atmospheric pressure) and crystallized, and the silicon film was patterned to a size of 10–1000 μm and the island-like silicon film (TFT active layer) 203 was formed.

(FIG. 1(A))

Figure 1A:
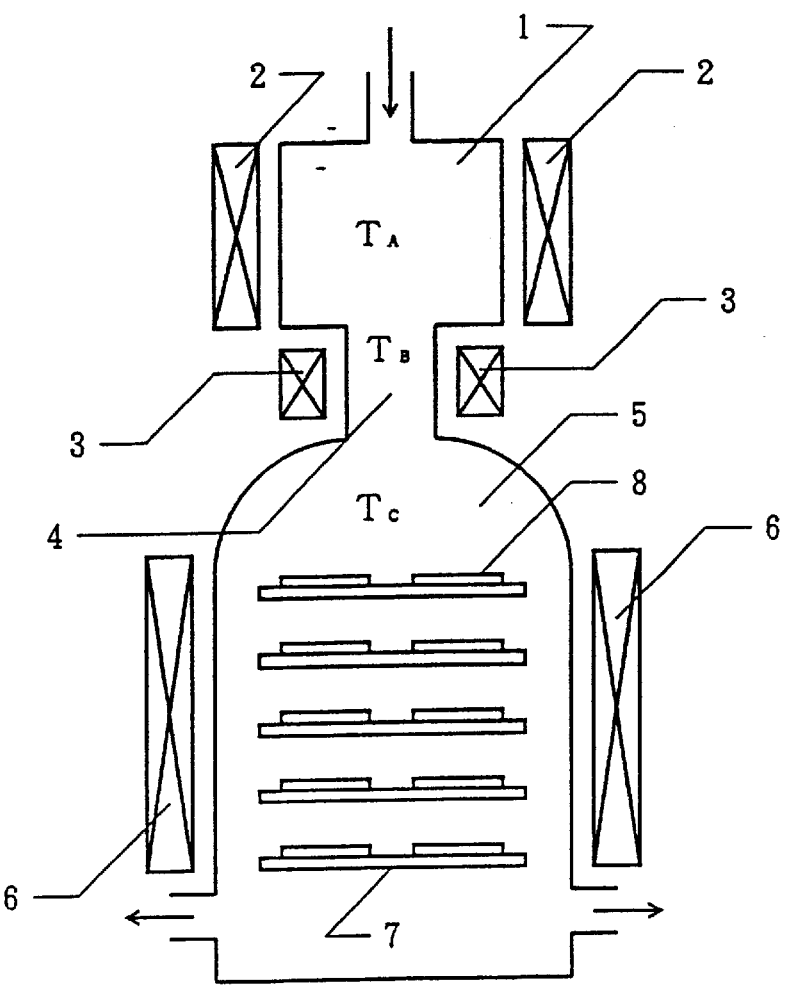
FIGS. 1A and 1B are schematic diagrams of the apparatuses in accordance with the present invention.
Figure 1B:
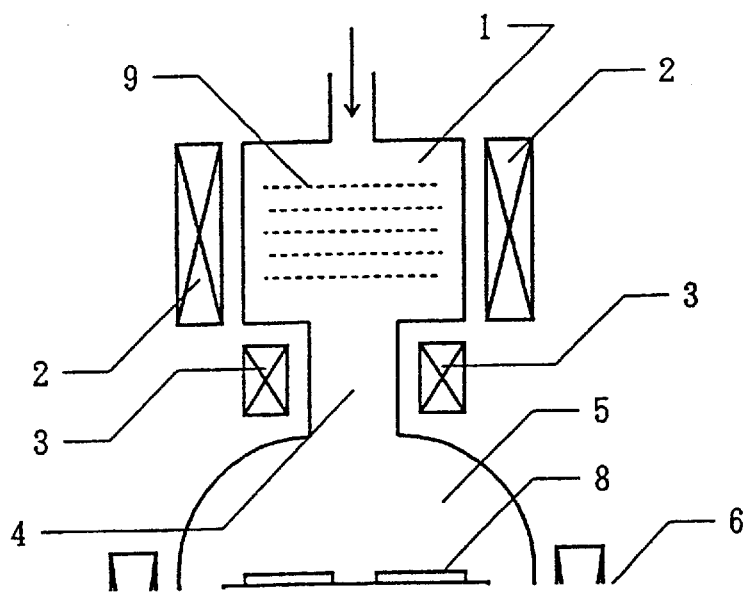
Figure 2A:
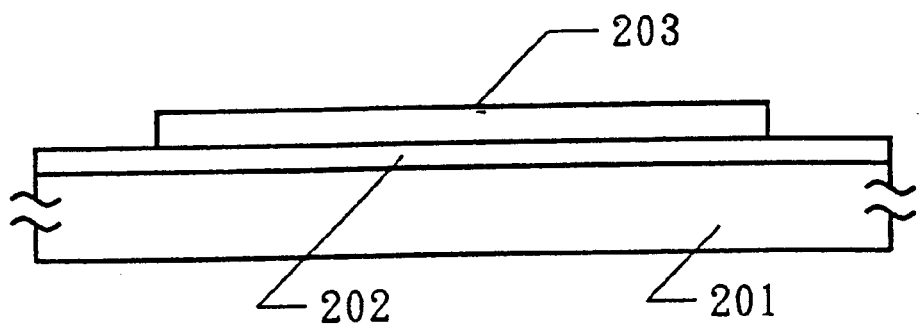
FIGS. 2A–2D are cross sectional views showing the manufacturing process in accordance with Example 1.
Figure 2B:
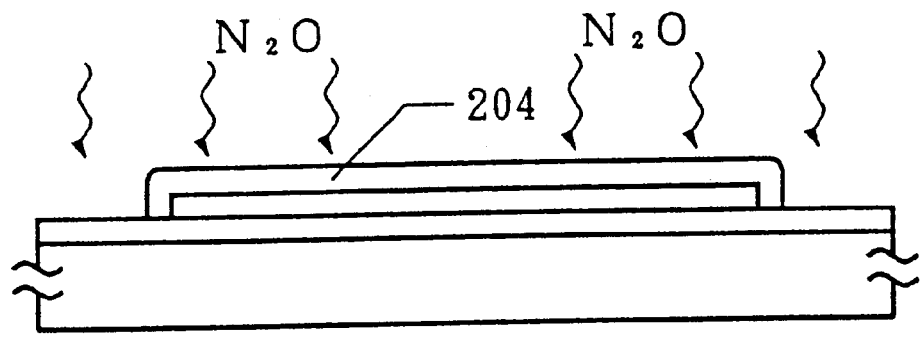
Figure 2C:
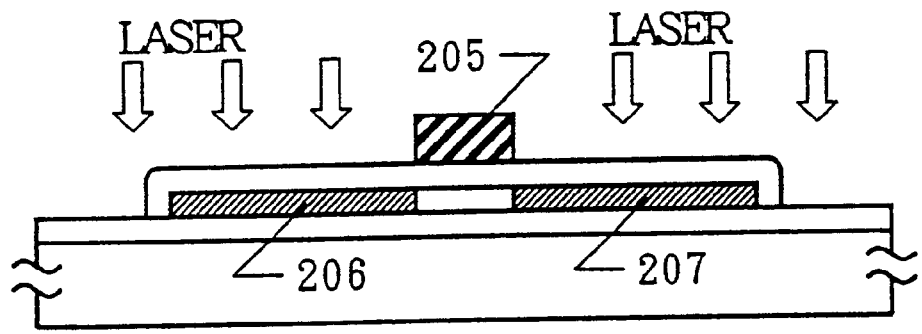
Figure 2D:
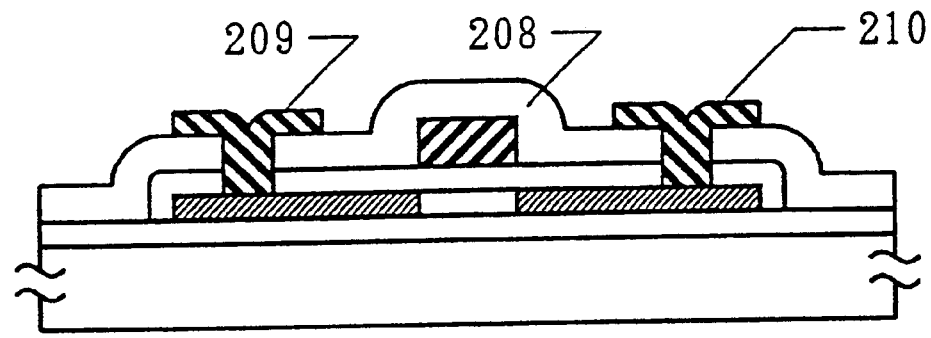
Figure 3A:
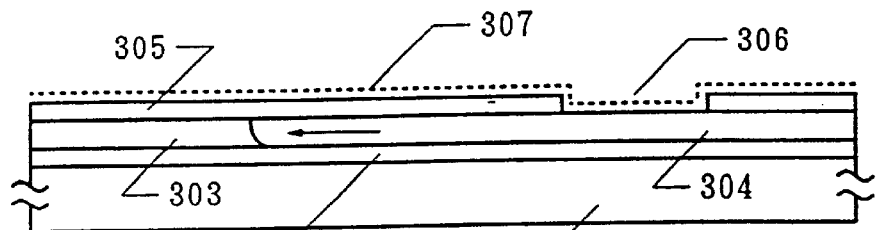
FIGS. 3A–3F are cross sectional views showing the manufacturing process in accordance with Example 2.
Figure 3B:
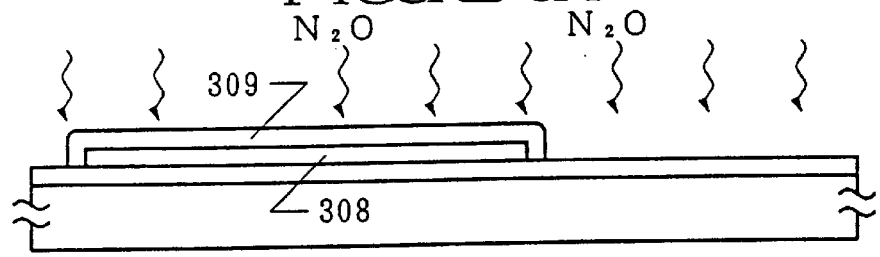
Figure 3C:
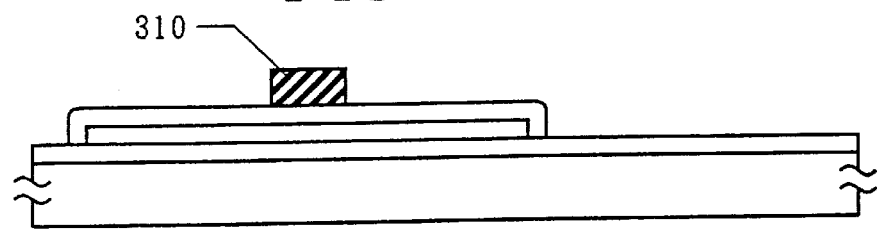
Figure 3D:
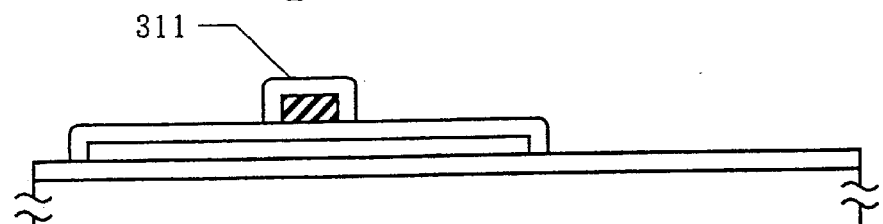
Figure 3E:
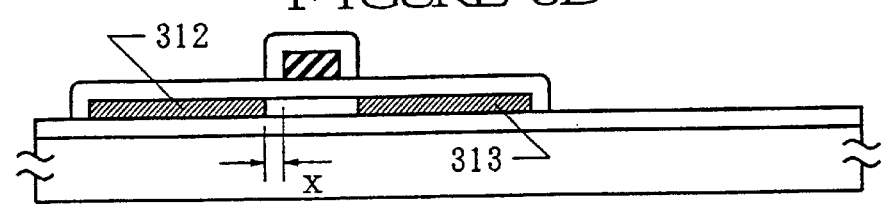
Figure 3F:
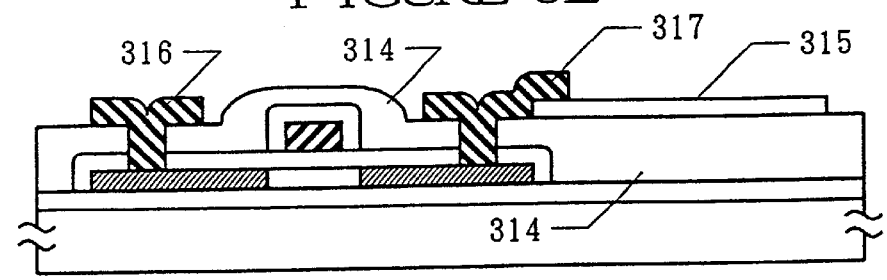
Figure 4A:
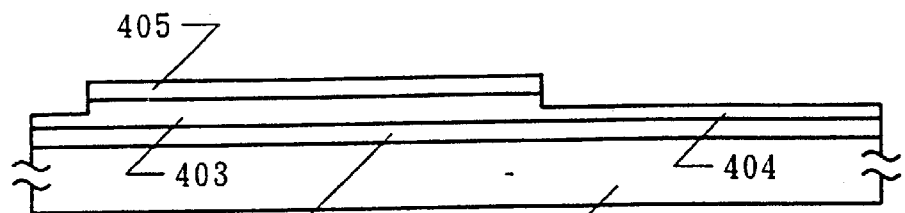
FIGS. 4A–4F are cross sectional views showing the manufacturing process in accordance with Example 3.
Figure 4B:
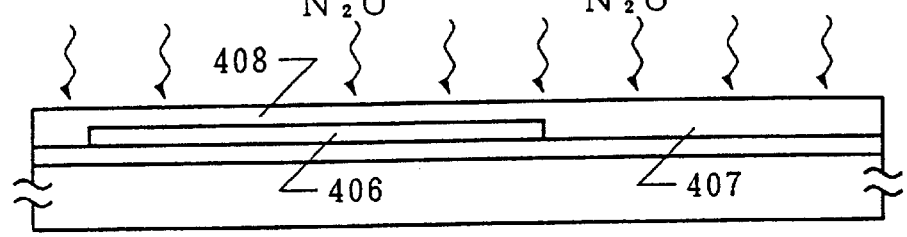
Figure 4C:
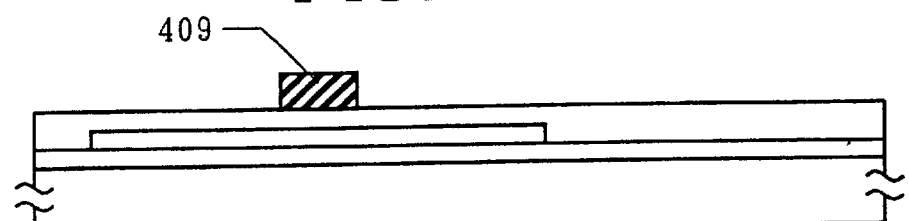
Figure 4D:
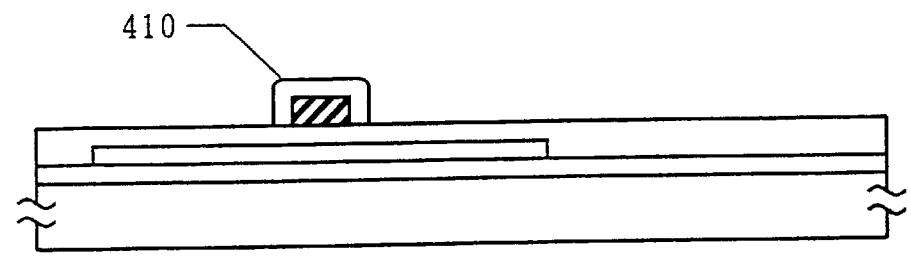
Figure 4E:
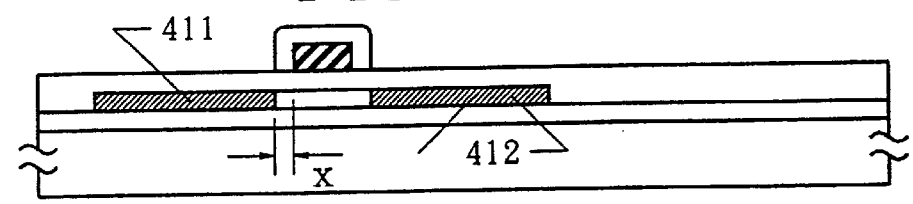
Figure 4F:
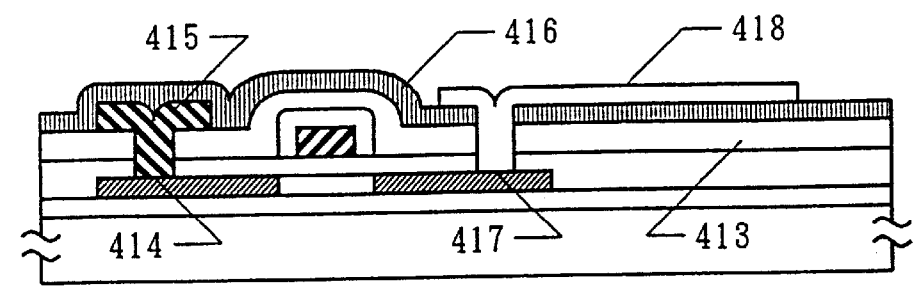
Figure 5:
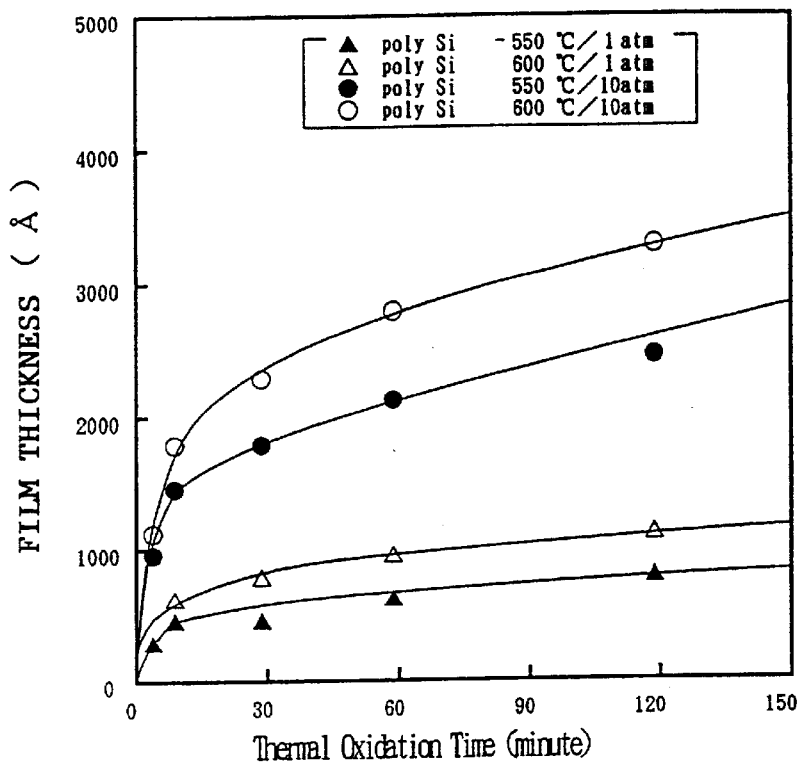
FIG. 5 shows the situation with low temperature (600° C. or below) thermal oxidation using the invention.

Subsequently, a thermal oxidation treatment of the present invention was carried out and the thermal oxide film 204 was formed on the surface of the active layer 203. The apparatus shown in FIG. 1 was used in this example. Furthermore, dinitrogen monoxide was used as the gas for the thermal oxidation. The temperature $T_A$ in the first reaction chamber 1 is preferably 750–950° C. and the temperature $T_C$ in the second reaction chamber 5 is preferably 500–650° C. In this example, $T_A$ was set to 850° C. and $T_C$ was set to 600° C. Furthermore, the temperature $T_B$ in the connecting passageway 4 was set to 750° C., intermediate between these two temperatures. The pressure in the reaction chambers was set to atmospheric pressure. Furthermore, the dinitrogen monoxide flow rate was set to 5 liters/minute in this example. Moreover, the thermal oxidation time was set to 0.5–6 hours, for example to 2 hours. The thermal oxide film 204 having a thickness of about 1000 Å was formed as a result.

(FIG. 2(B))

It should be pointed out that the original silicon film is reduced by at least 50 Å by this thermal oxidation and, as a result, the contamination of the outermost surface part of the silicon film is not spread along the interface between the silicon film and the silicon oxide film. That is to say, a clean silicon—silicon oxide boundary was obtained. The thickness of the silicon oxide film was about twice that of the silicon film which is oxidized and so in a case where a silicon film having a thickness of 1000 Å was oxidized and a silicon oxide film having a thickness of 1000 Å was obtained, the thickness of the remaining silicon film was 500 Å.

After forming the gate insulating film by thermal oxidation, a film of polycrystalline silicon (containing 0.01–0.2% phosphorus) having a thickness of 3000–8000 Å, for example having a thickness of 6000 Å, was formed using the reduced pressure CVD method. Then, the silicon film was etched and the gate electrode 205 was formed. Moreover, an impurity (in this case phosphorus) which provides an N-type electrical conductivity was added to the active layer 203 by means of the ion doping method (also known as the plasma doping method) in a self-alignment manner using this silicon film as a mask. Phosphine ($PH_3$) was used as the doping gas, and the accelerating voltage was set to 60–90 kV, for example to 80 kV. The dose rate was set to $1 \times 10^{14}$–$8 \times 10^{16}$ atoms/cm$^2$, for example to $1 \times 10^{15}$ atoms/cm$^2$. The N-type impurity regions (source and drain) 206 and 207 were formed as a result.

Subsequently, a photo-anneal was carried out by irradiation with laser light. A KrF excimer laser (wavelength 248 nm, pulse width 20 nsec) was used for the laser light, but other lasers could be used. The laser light irradiation conditions were energy density 200–400 mJ/cm$^2$, for example 250 mJ/cm$^2$, with 2–10 shots, for example 2 shots, per location. The effect may be enhanced by heating the substrate to a temperature of 200–450° C. during the irradiation with laser light.

(FIG. 2(C))

Furthermore, the photo-annealing process may be achieved by means of a lamp anneal with near infrared light. Near infrared radiation is absorbed more easily by the crystallized silicon than the amorphous silicon and an effective anneal similar to a thermal anneal at a temperature of 1000° C. or above can be realized. On the other hand, a glass substrate absorbs little of the radiation (far infrared is absorbed by a glass substrate but visible light and near infrared light (wavelength 0.5–4 μm) are not absorbed readily) and so the glass substrate is not heated to a high temperature and, since the treatment time is short, this is an ideal method in a process where shrinkage of the glass substrate due to heat is a problem.

Next, the silicon oxide film 208 having a thickness of 6000 Å was formed by means of the plasma CVD method as an inter-layer insulating material. Moreover, contact holes were formed and the TFT electrodes and wiring 209 and 210 were formed with a metal material, such as multi-layer film of titanium nitride and aluminum for example. A TFT was realized by means of the processes described above.

(FIG. 2(D))

The mobility of the TFT obtained using the procedure described above was 110–150 cm$^2$/Vs and the S value was 0.2–0.5 V/order of magnitude. Furthermore, on manufacturing P-channel type TFT in which boron was doped into the source and drain using the same procedure as before, the mobility was 90–120 cm$^2$/Vs and the S value was 0.4–0.6 V/order of magnitude, and the mobility was at least 20% higher and the S value was at least 20% lower than in cases where the gate insulating films was formed using the known PVD methods or CVD methods.

Furthermore, from the viewpoint of reliability, the TFT produced in this example gave good results which were on a par with those of TFT produced by high temperature thermal oxidation at 1000° C.

Example 2

This example is directed to the manufacturing process of a TFT which is used to control a picture element of an active matrix. The production process of this example is shown in FIGS. 3A–3F. First of all, in the same way as in Example 1, the glass substrate (Corning 7059) was annealed for 1–4 hours, for example for 1 hour, at a temperature of 620–660° C., for example at 640° C., which was higher than the strain point (593° C.) and then it was cooled gradually at a rate of 0.03 1° C./minute, for example at a rate of 0.2° C./minute, and taken out at the stage where the temperature had fallen to 400–500° C., for example to 450° C.

The substrate 301 which had been treated in this way was washed and the silicon oxide base film 302 having a thickness of 2000 Å was formed by means of the plasma CVD method using TEOS (tetraethoxysilane) and oxygen as the raw materials. Then, an intrinsic (I type) amorphous silicon film 303 having a thickness of 500–1500 Å, for example 1000 Å, was formed by means of the plasma CVD method. Then, following on continuously, the silicon oxide film 303 having a thickness of 500–2000 Å, or example having a thickness of 1000 Å, was formed by means of the plasma CVD method. Then, the silicon oxide film 305 was etched selectively to form the exposed region of amorphous silicon 306. Then, the nickel film 307 of average thickness 20–50 Å was formed using the sputter method over the whole surface. The nickel film need not be a continuous film. Furthermore, a spin coating method may be used instead of the sputter method.

Here, the nickel had the effect of promoting the crystallization of the amorphous silicon. By using the nickel it was possible to carry out the crystallization at a lower temperature than the usual solid phase growth temperature and for a shorter period of time.

Subsequently, a thermal anneal was carried out for 8 hours at 500 620° C., for example at 550° C., in a nitrogen atmosphere, and the silicon film 303 was crystallized. The crystallization proceeded in a direction parallel to the substrate, as shown by the arrow, with the region 306 where the silicon film made contact with the nickel as the origin. The region 304 shows the crystallized part and the region 303 shows the uncrystallized (amorphous) part in the drawing.

(FIG. 3(A))

Next, the silicon oxide film 305 was removed and, after patterning the silicon film 304, this was dry etched and the island-like active layer region 308 was formed. At this time, the region shown as 306 in FIG. 3(A) was the region into which the nickel had been introduced directly and in which the nickel was present at a high concentration. Furthermore, it was confirmed that nickel was present at quite a high concentration at the leading end of the crystal growth. It was clear that the nickel concentration in these regions was approaching an order of magnitude higher than that in the region between these regions. Hence, in this example, it was arranged that these regions of the high nickel concentration did not overlap with the channel forming region in the active layer 308. The nickel concentration in the active layer in this example when measured using SIMS (secondary ion mass spectroscopy) was some $1\times10^{17}1\times10^{19}$ atom.cm$^{-3}$.

A thermal oxidation treatment of this invention was carried out after forming the active layer and the gate insulating film 309 was formed. The thermal oxidation apparatus shown in FIG. 1 was used in this example. A gaseous mixture of dinitrogen monoxide and argon (dinitrogen monoxide:argon=1:1) was used for the thermal oxidation, and the temperature $T_A$ of the first reaction chamber 1 was set to 700° C., the temperature $T_B$ in the connecting passageway 4 was set to 650° C. and the temperature $T_C$ in the second reaction chamber was set to 600° C. The pressure in the reaction chambers was set to 1 atmosphere, the reaction gas flow rate was set to 3 liters/minute and the thermal oxidation time was set to 2 hours. Moreover, mesh-like platinum was provided as a catalyst in the first reaction chamber 1. Consequently, the temperature in the first reaction chamber 1 could be lower than in Example 1, and the decomposition of the dinitrogen monoxide was promoted so that a similar effect to that in Example 1 could be obtained with a smaller amount of dinitrogen monoxide. The thermal oxide film 309 having a thickness of about 1000 Å was formed in this way.

(FIG. 3(B))

Next, an aluminum film (containing 0.01–0.2% scandium) having a thickness of 3000–8000 Å, for example 6000 Å, was then formed using the sputtering method. This aluminum film was then etched and the gate electrode 310 was formed.

(FIG. 3(C))

Moreover, the surface of this aluminum electrode was anodically oxidized and the oxide layer 311 was formed on the surface. The anodic oxidation was carried out in an ethylene glycol solution which contained 1–5% of tartaric acid. The solution was adjusted to pH 6.8–7.2 using ammonia. The oxide layer 311 obtained was having a thickness of 2000 Å. Moreover, the oxide 311 was of a thickness which formed an offset gate region in the subsequent ion doping process and so the length of the offset gate region was determined in the above mentioned anodic oxidation process.

(FIG. 3(D))

Next, an impurity (in this case phosphorus) which provides an N-type electrical conductivity was added to the active layer 308 by means of the ion doping method in a self-alignment manner using the gate electrode part, which is to say the gate electrode 310 and the surrounding oxide layer 311, as a mask. Phosphine (PH$_3$) was used as the doping gas, and the accelerating voltage was set to 60–90 kV, for example to 80 kV. The dose rate was set to $1\times10^{14}$–$8\cdot10^{15}$ atoms/cm$^2$, for example to $4\times10^{15}$ atoms/cm$^2$. The N-type impurity regions 312 and 313 were formed as a result. As is clear from the drawing, the N-type impurity regions and the gate electrode were offset with the displacement distance x. Such an offset state is especially effective for reducing the leakage current (known as the OFF current) when a reverse voltage (a negative voltage in the case of an N-channel TFT) is applied to the gate electrode. In the case of the TFT which control the picture elements of an active matrix, as in the case of this example, in particular, a low leakage current such that the charge which has been accumulated on the picture element electrode does not escape is desirable for obtaining good images and so the establishment of the offset is effective in this case.

Subsequently, a photo-anneal by irradiation with laser light was carried out. A KrF excimer laser (wavelength 248 nm, pulse width 20 nsec) was used for the laser light. The laser light irradiation conditions were energy density 200–400 mJ/cm$^2$, for example 250 mJ/cm$^2$, with 2–10 shot irradiation, for example 2 shot irradiation, per location. The effect may be enhanced by heating the substrate to a temperature of 200–450° C. during the irradiation with laser light.

(FIG. 3(E))

Next, the silicon oxide film 314 having a thickness of 6000 Å was formed as an intermediate insulating material using the plasma CVD method. Moreover, the transparent electrically conductive film (ITO film) having a thickness of 800 Å was formed on the silicon oxide film 314 using the sputter method, and this was then etched and the picture element electrode 315 was formed.

Then, contact holes were formed in the inter-layer insulating material 314 and the gate insulating film 309 and the TFT electrodes and wiring 316 and 317 were formed with a metal material, such as a multi-layer film of titanium nitride and aluminum for example. Finally, a 30 minute anneal at 350° C. in a hydrogen atmosphere at 1 atmosphere pressure was carried out and the picture element circuit for an active matrix which had a TFT was completed.

(FIG. 3(F))

An active matrix circuit was formed in the way described above. A protective film (passivation film) of silicon nitride may also be formed covering the TFT in order to protect the circuit.

Example 3

Cross sectional drawings which illustrate the manufacturing process of this example are shown in FIGS. 4A–4F. First of all, a Corning 7059 glass was used for the substrate 401, in the same way as in Example 1, and the base film 402 having a thickness of 2000 Å was formed by means of the plasma CVD method with TEOS as the raw material. Then, an intrinsic (I type) amorphous silicon film having a thickness of 100–1000 Å, for example 800 Å, was formed using the plasma CVD method.

Then, a trace amount of an element which promotes the crystallization of amorphous silicon, such as nickel, iron, platinum, palladium or cobalt for example, was added and thermal annealing was carried out, and the crystalline silicon film 13 was obtained. In this example a solution of nickel acetate was dripped onto the amorphous silicon film and a very thin film of nickel acetate was formed on the amorphous silicon film using the spin drying method. Then, the nickel was introduced into the amorphous silicon film and crystallization was achieved by carrying out a 4 hour thermal anneal at 550° C. in a nitrogen atmosphere.

Subsequently, a laser anneal was carried out using a KrF excimer laser (wavelength 248 nm) in order to improve the crystallinity further.

A laser energy density of 250–350 mJ/cm$^2$ is appropriate. In this example it was set to 300 mJ/cm$^2$. A crystalline silicon film could be obtained in the way described above. The crystalline silicon film obtained in this way had comparatively large (about 10 μm square) crystal grains, and it had a mono-domain structure in which the same crystal orientation was shown in the range from a few times to a few tens of times.

Next, a silicon nitride film was formed and this was etched to form the silicon nitride mask 405. Then, 300 Å of the silicon film was etched away by dry etching, using the mask 405, and the thick region 403 and the thin region 404 of the silicon film were formed. The thick region 405 of the silicon film formed the active layer of the TFT. In this example, such active layers were formed at random but many of them were observed to have the channel forming region of the TFT as mono-domain structure.

(FIG. 4(A))

Moreover, a thermal oxidation treatment of this invention was carried out with the mask 405 in place, and the thin region 404 was oxidized to form the silicon oxide film 407. The apparatus shown in FIG. 6 was used in this example. In this apparatus, no part was specially established corresponding to the first reaction chamber 1 of FIG. 1A, and the construction was such that the gas was rendered reactive by heating part of the reaction gas feed pipe 63 with the heater 64 and introduced into the reaction chamber 61. A multiple receptor 65 was established in the reaction chamber 61 and the substrates 66 were arranged on this respectively. The reaction chamber 61 was maintained at a constant temperature by means of the heater 62. In this example the internal diameter of the feed pipe 63 was set to 20–25 mmφ. Furthermore, a distance from the site of the heater 64 to the reaction chamber of 10–150 cm was appropriate.

Figure 6:
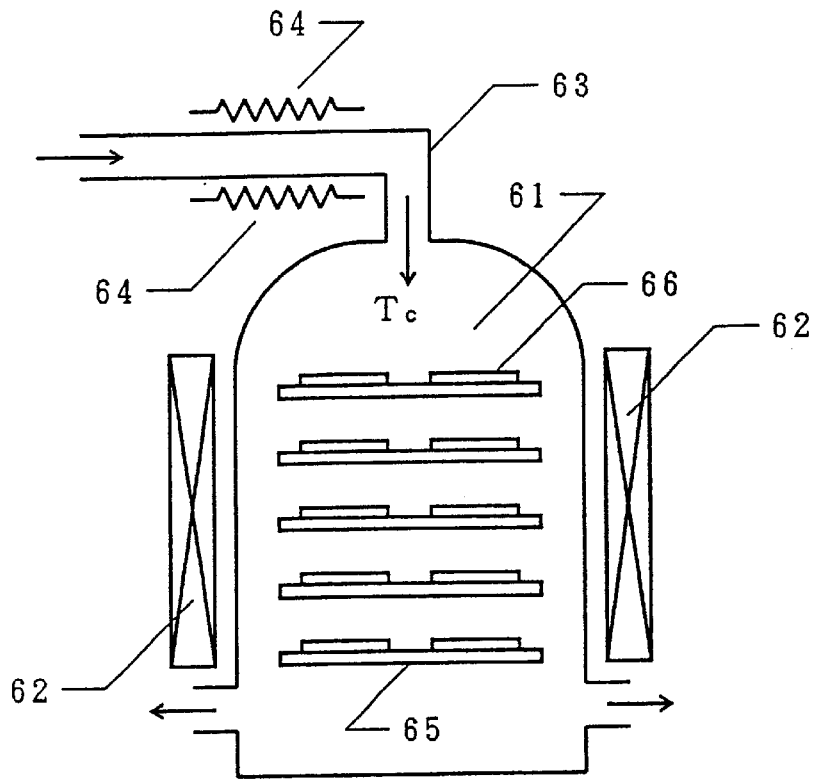
FIG. 6 is a schematic diagram of the apparatus in accordance with the present invention.
Figure 7A:
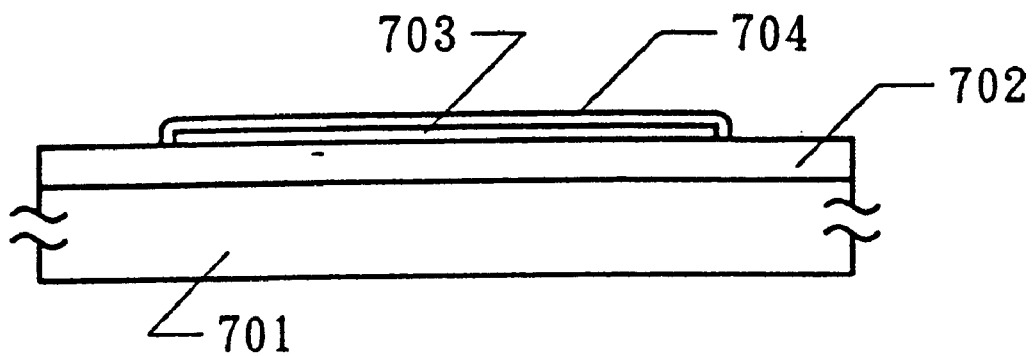
FIGS. 7A–7D are cross sectional views showing the manufacturing process in accordance with Example 4.
Figure 7B:
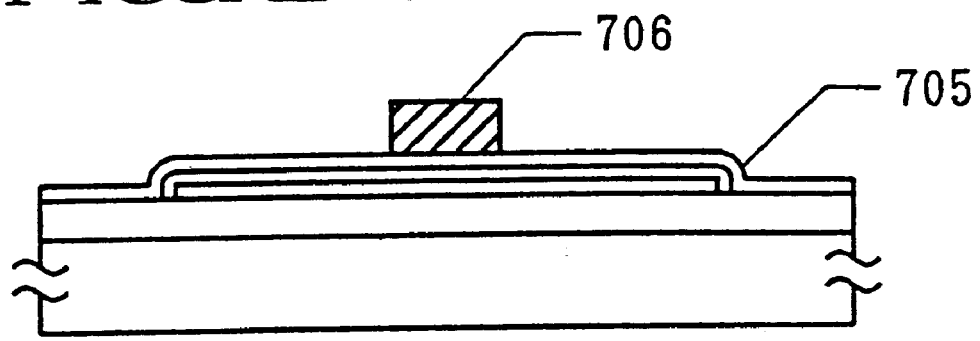
Figure 7C:
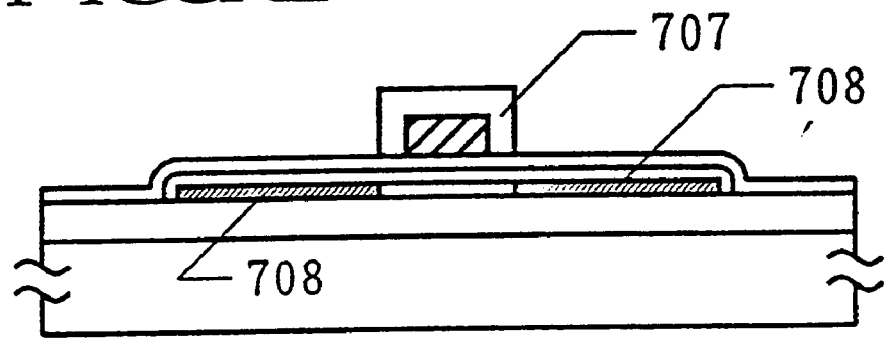
Figure 7D:
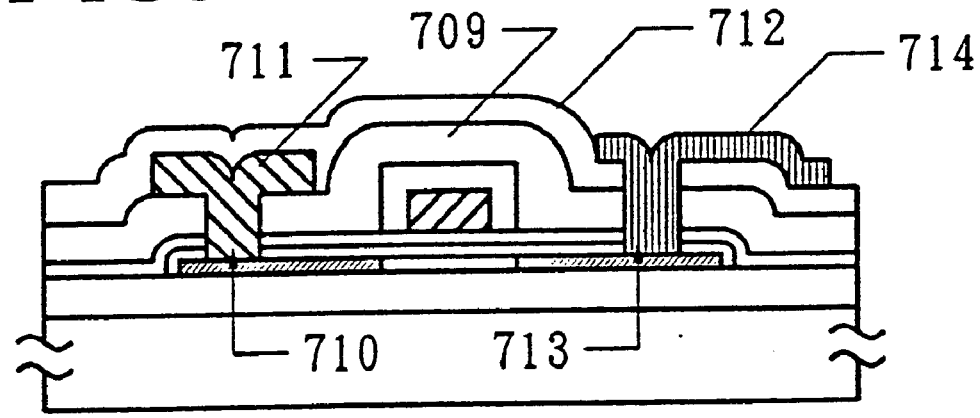

The temperature of the part of the feed pipe where the heater 64 was provided in the apparatus shown in FIG. 6 was such that the gas was decomposed and, moreover, it was set in such a way that the temperature of the part from the part to where it reached the reaction chamber was higher than the temperature $T_C$ in the reaction chamber 61.

Dinitrogen monoxide was used as the thermal oxidation atmosphere in this example. The dinitrogen monoxide was passed through the feed pipe 63 at a flow rate of 5 liters/minute. The heater 64 is set so that the temperature is 750–950° C. The temperature in the reaction chamber 61 is preferably 500–650° C. In this example the heater 64 temperature was set to 900° C. and the temperature in the reaction chamber 61 was set to 550° C. Thermal oxidation was carried out for 4 hours under these conditions. It was possible in this way to form the silicon oxide film 407 with a thickness of about 1000 Å. As a result, the thin silicon film regions 403 were surrounded by the silicon oxide 407 and were insulated from one another.

Subsequently, the mask 405 was removed and the surface of the thick silicon film region 403 was exposed. Then, the silicon oxide film 408 was formed on this surface using the same procedure as that used for the thermal oxidation of the silicon oxide 407 described above. However, on this occasion the oxidation period was set to 1 hour and so the thickness of the silicon oxide film 408 was 500 Å. The active layer 406 was formed in this way.

(FIG. 4(B))

Then, a film of aluminum (containing 0.01–0.2% scandium) having a thickness of 3000–8000 Å, for example having a thickness of 6000 Å, was then formed using the sputtering method. This aluminum film was then etched and the gate electrode 409 was formed.

(FIG. 4(C))

Moreover, the surface of this aluminum electrode was anodically oxidized and the oxide layer 410 was formed on the surface. This anodic oxidation was carried out in the same way as in Example 2. The oxide layer 410 obtained had a thickness of 2000 Å.

(FIG. 4(D))

Next, an impurity (in this case phosphorus) which provides an N-type electrical conductivity was added to the active layer 406 in a self-alignment manner using the gate electrode 409 and the surrounding oxide layer 410, as a mask. Phosphine (PH$_3$) was used as the doping gas, and the accelerating voltage was set to 60–90 kV, for example to 80 kV. The dose rate was set to $1 \times 10^{14}$–$8 \times 10^{15}$ atoms/cm$^2$, for example to $4 \times 10^{14}$ atoms/cm$^2$. The N-type impurity regions 411 and 412 were formed as a result.

Subsequently, a photo-anneal by irradiation with laser light was carried out. A KrF excimer laser (wavelength 248 nm, pulse width 20 nsec) was used for the laser light. The laser light irradiation conditions were energy density 200–400 mJ/cm$^2$, for example 250 mJ/cm$^2$, with 2–10 shot irradiation, for example 2 shot irradiation, per location.

(FIG. 4(E))

Then, the silicon nitride film 413 was formed as an inter-layer insulating material using the plasma CVD method. Then, the silicon nitride inter-layer insulating material 413 and the silicon oxide film 408 were etched and the contact hole 414 was formed. Buffered hydrofluoric acid (for example a liquid mixture of hydrogen fluoride and ammonium fluoride) was used to etch the contact hole. A silicon nitride film which was formed by plasma CVD has a lower etching rate than a silicon oxide film which was formed by a PVD method or a CVD method, but in this example the etching rate was of the same order as that of the silicon nitride inter-layer insulating material 413 since the silicon oxide film 408 was obtained by thermal oxidation.

Consequently, the contact hole obtained was of approximately the same diameter from top to bottom. Such a structure is effective for preventing breaks in the wiring in the contact hole part. Conversely, breaks in the wiring are liable to occur if the diameter of the bottom part of the contact hole is greater than that at the top. Moreover, in this example the silicon nitride inter-layer insulating material 413 also functions as a protective film, preventing the ingress of water and mobile ions from the outside into the TFT.

An aluminum film was formed using the sputter method after forming the contact hole, and this was etched to form the source electrode and wiring 415. Moreover, the polyimide film 416 having a thickness of 2000 Å was formed with the spin coating method. The polyimide film 416, the silicon nitride inter-layer insulating material 413 and the gate insulating film 408 were etched and the contact hole 417 was formed.

Then, a transparent electrically conductive film (ITO film) was formed and patterned to form the picture element electrode 418. An active matrix circuit could be formed in this way.

(FIG. 4(F))

In this example, the thickness of the gate insulating film was thinner than in the other examples at 500 Å, but there were no pinholes when compared with those formed using the conventional PVD methods and CVD methods and, since the withstand voltage was high, there was no problem in practice. Furthermore, in those cases where the TFT have a mono-domain structure, as in this example, the characteristics are impeded if the gate insulating film is thicker than is required. In this connection, the advantages of the mono-domain structure can be fully realized if the thickness is of the order of 500 Å as in this example.

Furthermore, in Examples 1 and 2, the step difference of the active layer, including the gate insulating film, was 1500 Å, and if the step difference covering of the gate electrode was inadequate then breaks occurred in the gate electrode and wiring. In this connection, the step difference covering was enough high in this example and this was an advantage.

Example 4

Cross sectional drawings which illustrate the manufacturing process of this example are shown in FIGS. 7A–7D. First of all, the base silicon oxide film 702 (thickness 2000 Å) and the crystalline island-like silicon film 703 having a thickness of 750 Å were formed on the glass substrate 401. A thermal oxidation treatment of this invention was carried out and the silicon film 703 was oxidized to form the silicon oxide film 704. In this example, the apparatus used in Example 3 was used in this example.

In this example, a flow rate of 5 liters/minute of 100% dinitrogen monoxide was passed at 1 atmosphere pressure. The temperature in the reaction chamber 2 was preferably 500–650° C. In this example it was set to 550° C. Thermal oxidation was carried out for 1 hour under the conditions outlined above. The silicon oxide film 704 having a thickness of about 500 Å was formed as a result.

(FIG. 7(A))

Subsequently, the silicon oxide film region 705 having a thickness of 500 Å was formed by means of the plasma CVD method. Monosilane and dinitrogen monoxide were used as raw materials. The substrate temperature was set to 400–500° C., for example to 430° C. Then, a film of aluminum (containing 0.01–0.2% scandium) having a thickness of 3000–8000 Å, for example having a thickness of 6000 Å, was formed by means of the sputtering method. Then, the aluminum film was etched and the gate electrode 706 was formed.

(FIG. 7(B))

Moreover, the surface of this aluminum electrode was anodically oxidized and the oxide layer 707 was formed on the surface. This anodic oxidation was carried out in the same way as in Example 2. The oxide layer 707 obtained was having a thickness of 2000 Å.

Next, an impurity (in this case phosphorus) which provided N-type electrical conductivity was added to the active layer 704 by means of the ion doping method in a self-alignment manner using the gate electrode part, which is to say the gate electrode 706 and. the surrounding oxide layer 707, as a mask. Phosphine ($PH_3$) was used as the doping gas, and the accelerating voltage was set to 80 kV. The dose rate was set to $4\times10^{14}$ atoms/$cm^2$. The N-type impurity region 708 was formed as a result.

(FIG. 7(C))

Subsequently, a photo-anneal by irradiation with laser light was carried out. A KrF excimer laser (wavelength 248 nm, pulse width 20 nsec) was used for the laser light.

Then, the silicon nitride film 709 was formed as an inter-layer insulating material using the plasma CVD method. Then, the silicon nitride inter-layer insulating material 709 was etched and the contact hole 710 was formed.

An aluminum film was formed using the sputter method after forming the contact hole, and this was etched to form the source electrode and wiring 711. Moreover, the silicon oxide film 712 was formed with a thickness of 2000 Å using the plasma CVD method. Then, the silicon oxide film 712 and the silicon nitride inter-layer insulating material 709 were etched and the contact hole 713 was formed.

Then, a transparent electrically conductive film (ITO film) was formed and this was etched to form the picture element electrode 714. An active matrix circuit could be formed in this way.

(FIG. 7(D))

In this example, the gate insulating film was formed as a double layer with the thermal oxide film and the silicon oxide film which had been formed with the plasma CVD method, and it was possible in this way to obtain a sufficient thickness in a short period of time.

The characteristics of TFT can be greatly improved by means of this invention. There are few defects of the type which can trap electrons when hot electrons are implanted in particular in a gate insulating film obtained by means of this invention, and deterioration of the characteristics can be prevented and the reliability of the element is increased. Furthermore, the thermal oxide films obtained in accordance with this invention do not have pinholes even though they are thin and so the product yield can also be increased. In particular, the formation of gate insulating films has been carried out conventionally using the various PVD methods and CVD methods, but flakes and particles are produced with these methods of film formation and so much time is taken up with maintenance of the apparatus and the mass productivity has been low but, with the present invention, there is hardly any flake or particle formation of this sort. Consequently, the maintenance time of the apparatus is shortened and the mass productivity is improved. Furthermore, the initial investment when executing the invention is similar to, or less than, that of the conventional PVD methods and CVD methods.

What is claimed is:

1. A method of manufacturing a semiconductor device having a thin film transistor comprising:
    forming a semiconductor film comprising amorphous silicon over a substrate having an insulating surface;
    crystallizing the semiconductor film; and
    oxidizing the crystallized semiconductor film in a reactive gas comprising a nitrogen oxide at a pressure of 1 to 15 atm.

2. A method according to claim 1 further comprising a step of adding a material for promoting crystallization of silicon to the semiconductor film before said crystallizing, wherein said material for promoting crystallization of silicon is selected from the group consisting of nickel, iron, platinum, palladium, and cobalt.

3. A method according to claim 1 further comprising patterning said semiconductor film to form a semiconductor island before said oxidizing.

4. A method according to claim 1 further comprising annealing the semiconductor film in an atmosphere containing hydrogen and nitrogen after the oxidizing.

5. A method according to claim 4 wherein the annealing is performed at a temperature of 400 to 700° C.

6. A method according to claim 1 further comprising heating said reactive gas in contact with a metal catalyst before said oxidizing.

7. A method according to claim 6, wherein said metal catalyst is selected from the group consisting of platinum, palladium, nickel, titanium, vanadium and cobalt.

8. A method according to claim 6, wherein said metal catalyst is in mesh form.

9. A method of manufacturing a semiconductor device having a plurality of thin film transistors, comprising the steps of:

forming a semiconductor film comprising amorphous silicon over a substrate having an insulating surface;

adding a material for promoting crystallization of silicon to the semiconductor film;

heating the semiconductor film at a temperature of 550 to 650° C.;

irradiating a laser beam to the semiconductor film; and oxidizing the semiconductor film in a reactive gas comprising a nitrogen oxide at a pressure of 1 to 15 atm.

10. A method according to claim 9 further comprising a step of annealing the semiconductor film in an atmosphere containing hydrogen and nitrogen after the oxidizing.

11. A method according to claim 10 wherein the annealing is performed at a temperature of 400 to 700° C.

12. A method according to claim 9 wherein said material for promoting crystallization silicon is selected from the group consisting of nickel, iron, platinum, palladium, and cobalt.

13. A method according to claim 9 further comprising a step of heating said reactive gas in contact with a metal catalyst before said oxidizing, wherein said metal catalyst is selected from the group consisting of platinum, palladium, nickel, titanium, vanadium and cobalt.

14. A method according to claim 9, wherein said oxidizing is performed at a temperature of 400–700° C.

15. A method according to claim 9, further comprising a step of patterning said semiconductor film to form a plurality of semiconductor islands before said oxidizing.

16. A method of manufacturing a semiconductor device having a plurality of thin film transistors, comprising the steps of:

forming a semiconductor film comprising amorphous silicon over a substrate having an insulating surface;

heating the semiconductor film at a temperature of 500 to 650° C.;

irradiating a laser beam to the semiconductor film; and oxidizing the semiconductor film in a reactive gas at a pressure of 1 to 15 atm, wherein said reactive gas is activated by heating with a metal catalyst.

17. A method according to claim 16 further comprising a step of annealing the semiconductor film in an atmosphere containing hydrogen and nitrogen after the oxidizing.

18. A method according to claim 17 wherein the annealing is performed at a temperature of 400 to 700° C.

19. A method according to claim 16 wherein said metal catalyst is in mesh form.

20. A method according to claim 16 further comprising a step of adding a material for promoting crystallization of silicon to the semiconductor film, wherein said material for promoting crystallization silicon is selected from the group consisting of nickel, iron, platinum, palladium, and cobalt.

21. A method according to claim 16 wherein said metal catalyst is selected from the group consisting of platinum, palladium, nickel, titanium, vanadium and cobalt.

22. A method according to claim 16, wherein said oxidizing is performed at a temperature of 400–700° C.

23. A method according to claim 16, further comprising a step of patterning said semiconductor film to form a plurality of semiconductor islands before said oxidizing.

* * * * *